(12) United States Patent
Zannoth et al.

(10) Patent No.: US 10,862,472 B1
(45) Date of Patent: Dec. 8, 2020

(54) SYSTEM AND METHOD OF CHARGING A BUFFER CAPACITOR

(71) Applicant: Infineon Technologies AG, Neubiberg (DE)

(72) Inventors: Markus Zannoth, Neubiberg (DE); Matthias Bogus, Munich (DE); Christian Heiling, Graz (AT); Ivan Muhoberac, Graz (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/508,896

(22) Filed: Jul. 11, 2019

(51) Int. Cl.
| H03K 17/06 | (2006.01) |
| H02P 27/06 | (2006.01) |
| H02M 7/5387 | (2007.01) |
| H02M 1/08 | (2006.01) |
| H02M 1/00 | (2006.01) |

(52) U.S. Cl.
CPC ............ H03K 17/063 (2013.01); H02M 1/08 (2013.01); H02M 7/53873 (2013.01); H02P 27/06 (2013.01); H02M 2001/0009 (2013.01); H03K 2217/0063 (2013.01); H03K 2217/0072 (2013.01)

(58) Field of Classification Search
CPC ..... H02P 27/08; H02M 1/08; H02M 3/33569; H02M 3/156; H02M 7/537; H02M 3/158; H02M 7/5383; H02M 7/219; H03K 17/284; H03K 5/08; H03K 5/2472; H03K 17/06

See application file for complete search history.

(56) References Cited

U.S. PATENT DOCUMENTS

| 5,138,200 | A | | 8/1992 | Barsanti et al. |
| 5,365,118 | A | * | 11/1994 | Wilcox ................... H02M 1/38 |
| | | | | 327/109 |
| 5,783,948 | A | | 7/1998 | Thomann et al. |
| 5,818,209 | A | | 10/1998 | Masini et al. |
| 8,558,586 | B1 | | 10/2013 | Martin et al. |
| 9,397,563 | B2 | * | 7/2016 | Kihara ................. H03K 17/063 |
| 9,590,608 | B2 | * | 3/2017 | Xu ........................ H03K 17/063 |
| 10,574,229 | B1 | * | 2/2020 | Nandi .................. H03K 17/063 |
| 2005/0102128 | A1 | | 5/2005 | Wilhelm |
| 2007/0146020 | A1 | | 6/2007 | Williams |
| 2008/0290911 | A1 | | 11/2008 | Williams |
| 2008/0291711 | A1 | | 11/2008 | Williams |
| 2010/0019807 | A1 | | 1/2010 | Zhang et al. |
| 2016/0065072 | A1 | | 3/2016 | Xiu et al. |
| 2017/0033677 | A1 | * | 2/2017 | Wu ........................ H02M 3/158 |
| 2017/0324411 | A1 | | 11/2017 | Gong et al. |

FOREIGN PATENT DOCUMENTS

| DE | 102013217173 A1 | 3/2014 |
| WO | 2009020535 A1 | 2/2009 |
| WO | 2012177873 A2 | 12/2012 |
| WO | 2019020215 A1 | 1/2019 |

* cited by examiner

*Primary Examiner* — Thai T Dinh
(74) *Attorney, Agent, or Firm* — Slater Matsil, LLP (57) ABSTRACT

In accordance with an embodiment, a method includes monitoring a first voltage across a buffer capacitor; activating a first current path between a power supply node and the buffer capacitor when the monitored first voltage is below a first threshold voltage, activating a second current path between the power supply node and the buffer capacitor when the monitored first voltage is below a second threshold voltage, and transferring power from the buffer capacitor to a driver circuit coupled across the buffer capacitor.

20 Claims, 6 Drawing Sheets

SYSTEM AND METHOD OF CHARGING A BUFFER CAPACITOR

TECHNICAL FIELD

The present invention relates generally to a system and method for charging a buffer capacitor.

BACKGROUND

AC motors such as three-phase motors are gaining popularity in applications such as automotive, industrial, and HVAC (heat, ventilating and air conditioning). By replacing the mechanical commutator used in traditional motors with electronic devices, improved reliability, improved durability and small form factors are achieved. Additional advantages of AC motors include better speed versus torque characteristics, faster dynamic response, and higher speed ranges, as examples. Generally, an AC motor (e.g., a three-phase motor) has a controller that generates a pulse-width modulated (PWM) signal used to produce drive signals for power switches coupled to different phases of the motor. These PWM signals may determine the average voltage and average current supplied to the coils of the motor, thus controlling the motor speed and torque.

The voltage levels of the drive signals used to activate the power switches are often higher than voltage levels provided to the motor control system. For example, a high side power switch that provides current to a motor from a 12 V car battery may need a drive voltage in excess of the 12 V provided by the car battery. Hence, in many systems, additional voltage boosting circuitry is used to generate the higher voltage levels used to activate the power switches. This voltage boosting circuitry may include, for example, a switched-mode power converter, a charge pump, and/or a boost capacitor. The use of such switched-mode voltage boosting circuitry, however, may create electrical interference that affects the operation of motor system in particular, or the operation of the system in which the motor resides.

SUMMARY

In accordance with an embodiment, a method includes: monitoring a first voltage across a buffer capacitor; activating a first current path between a power supply node and the buffer capacitor when the monitored first voltage is below a first threshold voltage, where the first current path provides a first current proportional to a difference between the first threshold voltage and the monitored first voltage up to a first maximum current; activating a second current path between the power supply node and the buffer capacitor when the monitored first voltage is below a second threshold voltage, where the second current path provides a second current proportional to a difference between the second threshold voltage and the monitored first voltage up to a second maximum current, where the first threshold voltage is greater than the second threshold voltage, and the first maximum current is less than the second maximum current; and transferring power from the buffer capacitor to a driver circuit coupled across the buffer capacitor.

In accordance with another embodiment, a system includes: a driver circuit having a driver circuit supply node configured to be coupled to a first terminal of a buffer capacitor, a reference node configured to be coupled a second terminal of the buffer capacitor, and a drive output configured to be coupled to a control node of a switching transistor; a first current path circuit coupled between a power supply node and the driver circuit supply node; a second current path circuit coupled between the power supply node and the driver circuit supply node; and a buffer capacitor monitoring circuit configured to: measure a first voltage between the driver circuit supply node and the reference node, activate the first current path circuit when the measured first voltage is below a first threshold voltage and cause to the first current path circuit to output a first current proportional to a difference between the first threshold voltage and the first voltage up to a first maximum current, and activate the second current path circuit when the measured first voltage is below a second threshold voltage and cause the second current path circuit to output a second current proportional to a difference between the second threshold voltage and the first voltage up to a second maximum current, wherein the first threshold voltage is greater than the second threshold voltage, and the first maximum current is less than the second maximum current.

In accordance with a further embodiment, a motor system includes: a half-bridge circuit including a high-side transistor and a low-side transistor; a high-side driver having an output coupled to a control node of the high-side transistor; a low-side driver having an output coupled to a control node of the low-side transistor; a buffer capacitor having a first terminal coupled to a boosted supply node and to a supply node of the high-side driver and a second terminal coupled to a reference node of the high-side driver and to an output node of the half-bridge circuit; a first transistor coupled between a power supply node and the boosted supply node, the first transistor configured to provide a first current; a second transistor coupled between the power supply node and the boosted supply node, the second transistor configured to provide a second current that is at least ten times greater than the first current; a buffer capacitor monitoring circuit configured to: measure a first voltage between the boosted supply node and the reference node, activate the first transistor when the measured first voltage is below a first threshold, measure a second voltage between the boosted supply node and the reference node, and activate the second transistor when the measured first voltage is below a second threshold, wherein the first threshold is greater than the second threshold; and an analog-to-digital converter coupled to the half-bridge circuit, the analog-to-digital converter configured to digitize a current flowing through the half-bridge circuit.

BRIEF DESCRIPTION OF THE DRAWINGS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for charging a buffer capacitor in the context of a motor control circuit. The invention, however, can be applied to other types of circuits that control the switching state of one or more transistors including, but not limited to switched-mode power supply systems, power systems, industrial control systems, audio systems and processing systems.

In accordance with an embodiment, a charging circuit used to charge a buffer capacitor of a switch driver using at least two different levels of current—a higher current level and a lower current level. The higher current level is used to charge the buffer capacitor when the buffer capacitor is highly discharged, the lower current level is used to charge the buffer capacitor when the buffer capacitor is discharged a lower degree. For example, the capacitor may be charged using the higher current level when the voltage across capacitor is less than a threshold voltage, while the capacitor may be charged using the lower current level when the voltage across the capacitor is greater than the threshold voltage (but less than a fully charged voltage). By using the lower current level to charge the buffer capacitor when the buffer capacitor is discharged to a lower degree, the occurrence of large current transients may be advantageously reduced or avoided. This reduction or avoidance of such current transients may also advantageously reduce the occurrence of interference induced measurement error.

Figure 1:
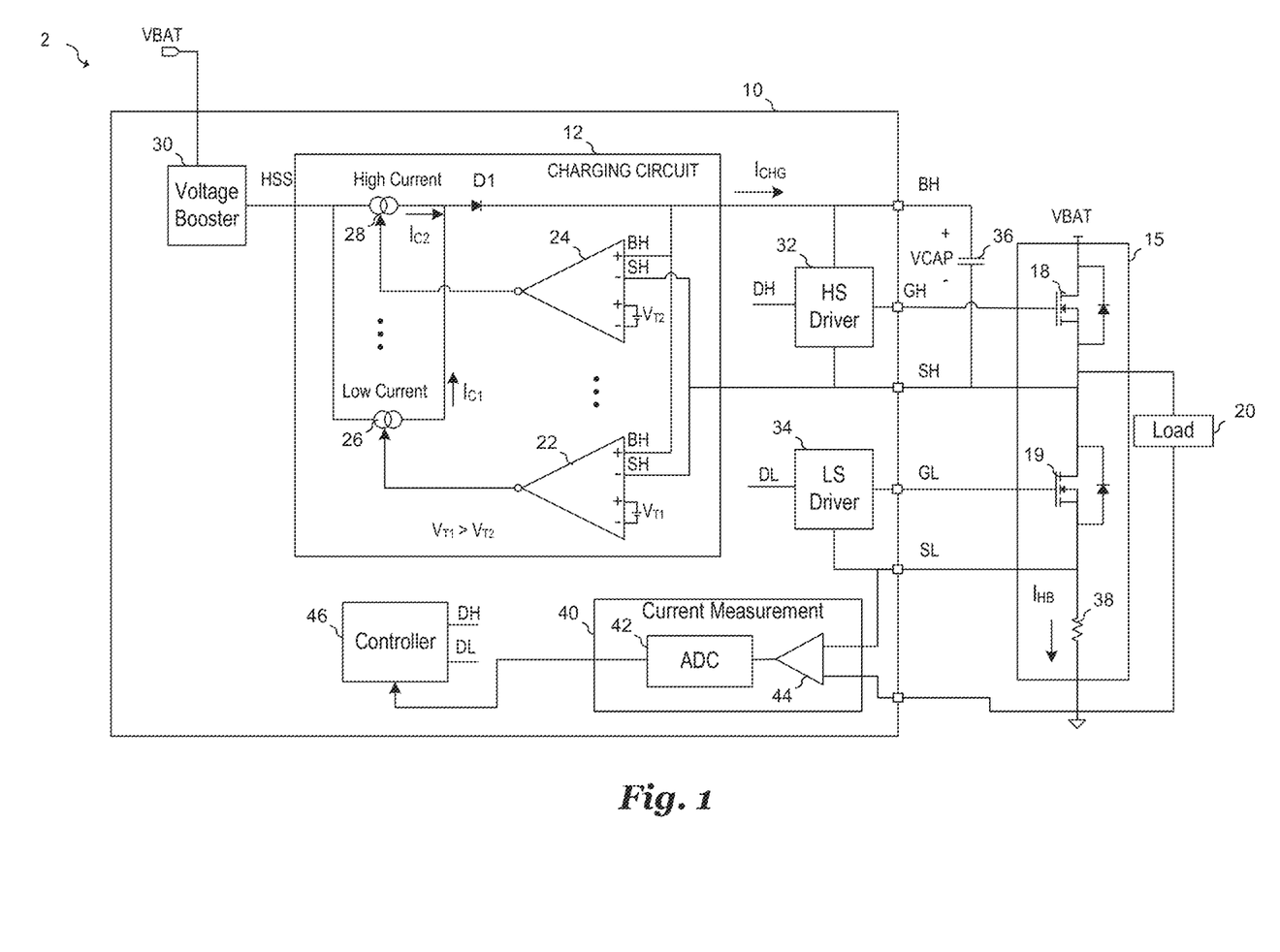
FIG. 1 illustrates a schematic of an embodiment charging system.

FIG. 1A illustrates a switching system 2 according to an embodiment of the present invention. As shown, charging system 2 includes integrated circuit 10 coupled a half-bridge driver 15 that includes high-side switching transistor 18 and low-side switching transistor 19. Half-bridge driver 15 is shown coupled to load 20, which may be representative of any type of load including, but not limited to a motor, an inductor or transformer in a switched-mode power supply, or other type of load. Integrated circuit 10 includes voltage booster 30, charging circuit 12, current measurement circuit 40, controller 46, drive circuit 32 configured to drive high-side switching transistor 18, and drive circuit 34 is configured to drive low-side switching transistor 19. In some embodiments, the various circuitry of integrated circuit 10 may be disposed on a single monolithic semiconductor integrated circuit, such as a single semiconductor substrate, and/or on the same monolithic semiconductor integrated circuit as other disclosed system components.

As shown, driver 32 is a floating gate driver coupled in parallel with buffer capacitor 36, which serves as a local power supply to driver 32, such that a one terminal of buffer capacitor 36 is coupled to a driver circuit supply node of driver 32 at boosted supply node BH, and the other terminal of buffer capacitor 36 is coupled to a reference node of driver 32 at output node SH. During operation, charging circuit 12 charges buffer capacitor 36 to a predetermined voltage in order to ensure that driver 32 has a power supply voltage high enough to turn-on high-side transistor 18. Charging circuit 12 includes a low current path circuit 26 (also referred to as a "first current path circuit"), amplifier 22 that controls low current path circuit 26, a high current path circuit 28 (also referred to as a "second current path circuit"), and amplifier 24 that controls high current path circuit 28. Amplifiers 22 and 24 may be collectively referred to as a buffer capacitor monitoring circuit. Diode D1 may be coupled between boosted supply node BH and to the outputs of low current path circuit 26 and high current path circuit 28 in order to prevent buffer capacitor from discharging through charging circuit 12. In alternative embodiments, additional current path circuits (along with additional corresponding controlling amplifiers) may be coupled in parallel with low current path circuit 26 and high current path circuit 28 in order to provide more granularity in the relationship between the voltage across buffer capacitor 36 and the amount of current provided by charging circuit 12.

During operation, amplifier 22 compares the voltage across buffer capacitor 36 (also referred to as a "first voltage") with a first threshold voltage $V_{T1}$, and controls the current of low current path circuit 26 according to the difference between the first voltage and first threshold voltage $V_{T1}$. Similarly, amplifier 24 compares the voltage across buffer capacitor 36 with a second threshold voltage $V_{T2}$, and controls the current of low current path circuit 26 according to the difference between the first voltage and first threshold voltage $V_{T2}$. In various embodiments, the current provided by high current path circuit 28 is higher than the current provided by low current path circuit 26, and the first threshold voltage $V_{T1}$ is higher than the second threshold voltage $V_{T2}$. For example, in one embodiment, the current provided by high current path circuit 28 is between about 100 mA and about 350 mA, the current provided by low current path circuit 26 is between about 10 mA and about 35 mA, the first threshold voltage $V_{T1}$ is about 10 V, and the second threshold voltage $V_{T2}$ is about 9 V. Other threshold voltages may be used depending on the particular embodiment and its specifications. In some embodiments, the current provided by high current path circuit 28 is about ten times greater than the current provided by low current path circuit 26; however, in other embodiments, the current provided by high current path circuit 28 is less ten times greater than the current provided by low current path circuit 26.

In various embodiments, the capacitance of buffer capacitor 36 is set such that the current supplied by low current path circuit 26 is sufficient to ensure that voltage VCAP across buffer 36 is greater than first threshold voltage $V_{T1}$ under nominal operating conditions. By using the relatively lower current of low current path circuit 26 to maintain the charge on buffer capacitor 36, the incidence of power supply disturbances seen across the power supply inputs of driver circuit 32 is significantly reduced compared to systems that utilize uncontrolled buffer capacitor charging and/or systems in which buffer capacitors are subject to high inrush currents. In such systems, such high inrush currents may cause current transients in the half-bridge driver. These current transients may lead to current measurement errors and affect the performance of the driver circuit. In some embodiments of the present invention, the use of low current path circuit 26 under nominal operating conditions may keep the magnitude of such current disturbances below one least-significant bit (LSB), as measured by analog-to-digital converter 42 and current measurement circuit 40 described below.

In non-nominal or emergency operational situations, however, the higher currents provided by high current path circuit 28 may be used to quickly recharge buffer capacitor 36. For example, in situations where charging system 2 is exposed to strong electromagnetic interference (EMI), electrostatic discharge (ESD), or other transient conditions, the voltage VCAP across buffer capacitor 36 may fall below second threshold voltage $V_{T2}$, in which case high current path circuit 28 is activated to quickly recharge buffer capacitor 36. Maintaining voltage VCAP across buffer capacitor 36 at a sufficiently high voltage prevents high-side transistor 18 from operating in an unsafe operating region that may result in the damage or destruction of high-side transistor 18. In such non-nominal or emergency situations, the inrush current caused by the fast charging of buffer capacitor 36 may cause a higher disturbance in half-bridge driver current $I_{HB}$ compared to the smaller disturbances seen during nominal operating conditions. In such situations, one or more current measurements made at the time of the electromagnetic interference event may be discarded and an error notification may be sent to an external system controller (not shown) to help facilitate an orderly recovery from the non-nominal or emergency system condition.

In some cases, the use of embodiment charging circuit 12 may help charging system 2 maintain compliance with various electromagnetic compatibility standards, such as International Organization for Standardization (ISO) standard 7637 directed to electromagnetic compatibility for road vehicles having 12 and 24 volt electrical systems. This standard, as well as other standards directed to various types of systems, defines various electromagnetic waveforms and pulses to which compliant systems are required withstand.

In various embodiments, voltage booster circuit 30 is configured to step-up or increase the voltage of input voltage VBAT to a higher voltage at power supply node HSS. For example, in one embodiment, input voltage VBAT is configured to have a voltage of about 12 V, while power supply node HSS is configured to have a voltage of about 24 V, however, other voltages for input voltage VBAT and power supply node HSS may be used depending on the particular embodiment and its specifications. In some embodiments, such as embodiments directed to automotive vehicle applications, input voltage VBAT may be a battery voltage or a voltage derived from battery voltage. In alternative embodiments, input voltage VBAT may be coupled to other power sources. Voltage booster circuit 30 may be implemented using a charge pump, a switched mode power supply circuit, or other voltage boosting circuits known in the art. In embodiments that utilize a switch mode power supply circuit for voltage booster circuit 30, various switch mode power supply architectures known in the art could be used, for example, a boost converter.

In some embodiments, the current $I_{HB}$ flowing through half-bridge 15 may be determined by current measurement circuit 40 by measuring the voltage across shut resistor 38. In some embodiments, current measurement circuit 40 may include analog-to-digital converter 42 and amplifier 44. Analog-to-digital converter 42 may be implemented using various analog-to-digital converter architectures such as a Sigma Delta analog-to-digital converter, a successive approximation analog to digital converter, a flash analog-to-digital converter, or any other suitable analog-to-digital converter architecture known in the art. In some embodiments, however, amplifier 44 may be omitted. During operation, amplifier 44 amplifies the voltage across resistor 38 and analog-to-digital converter 42 converts the analog output of amplifier 44 to the digital domain.

The output of analog-to-digital converter 42 may be used by controller 46, as a feedback signal for controlling switching signals DH and DL. For example, the measurement of current $I_{HB}$ may be used to determine when to activate and/or deactivate high-side transistor 18 and/or low-side transistor 19 according to switch control methods known in the art. The measurement of current $I_{HB}$ may also be used to implement overvoltage and overcurrent protection schemes according to methods known in the art. As mentioned above, in various embodiments, the amount of current disturbance to half-bridge current $I_{HB}$ as measured by analog-to-digital converter 42, may be maintained below one LSB of analog-to-digital converter 42. By maintaining this disturbance level below one LSB, high measurement accuracy in charging system 2 maybe maintained during operation. In such embodiments, it is possible for buffer capacitor 36 to be periodically recharged in a manner that is independent of drive signals and asynchronous with the sampling of analog-to-digital converter 42 without compromising measurement accuracy. In alternative embodiments of the present invention, charging system 2 could be configured such that the amount of disturbance caused by recharging buffer capacitor 36 during nominal operation causes more than 1 LSB of disturbance as measured by analog-to-digital converter 42 while still meeting performance requirements of the system.

In alternative embodiments of the present invention, current measurement circuit 40 may be omitted depending on the particular embodiment and its specifications. Similarly, resistor 38 shown in half-bridge circuit 15 may also be omitted for embodiments in which current $I_{HB}$ of half-bridge circuit 15 is not measured. In other embodiments, current $I_{HB}$ may be measured in a manner different from measuring the voltage across resistor 38. For example, in some embodiments one or both of high-side transistor 18 or low-side transistor 19 may include a replica current measuring transistor that provides a scaled version of the current flowing through one or both of high-side transistor 18 or low side transistor 19.

Driver circuit 32 includes a drive input DH and a drive output GH that is coupled to the gate (also referred to as a "control node") of high-side switching transistor 18. Similarly, driver circuit 34 includes a drive input DL and a drive output GL that is coupled to the gate of low-side switching transistor 19. During operation, driver circuit 32 produces a first drive output signal on drive output GH based on a first drive input signal on drive input DH. The first drive output signal may be configured to change a state of high-side switching transistor 18 (e.g., turn high-side switching transistor 18 on and off). Similarly, driver circuit 34 includes a drive input DL and a drive output GL that is coupled to the gate of low-side switching transistor 19. During operation, driver circuit 34 produces a second drive output signal on drive output GL based on a second drive input signal on drive input DL. The second output drive signal may be configured to change a state of low-side switching transistor 19 (e.g., turn low-side switching transistor 19 on and off).

In an example, when drive signal DH is asserted (either active high or active low), drive circuit 32 increases the voltage of drive signal GH such that high-side switching transistor 18 is turned on. When high-side switching transistor 18 is turned on, current is provided to load 20 and output node SH via the source of high-side switching transistor 18. When DH is de-asserted, drive circuit 32 decreases the voltage of drive signal GH such that high-side switching transistor 18 is turned off. Similarly, when drive signal DL is asserted (either active high or active low), drive circuit 34 increases the voltage of drive signal GL such that low-side switching transistor 19 is turned on. When low-side switching transistor 19 is turned on, current is drawn from load 20 and output node SH via the drain of low-side switching transistor 19. When drive signal DL is de-asserted, drive circuit 34 decreases the voltage of drive signal GL such that low-side switching transistor 19 is turned off. In embodiments that utilize p-channel or PNP devices, the various drive signals would decrease in voltage to turn-on the switching transistors and increase in voltage to turn-off the switching transistors.

In some embodiments, drive signals DH and DL are asserted in an alternating manner such that only one of high-side switching transistor 18 and low-side switching transistor 19 are active at one particular time. The generation of drive signals DH and DL may be performed using controller 46, as shown, or may be generated external to integrated circuit 10. Such drive signal generation circuitry may include, but is not limited to, pulse-width modulation circuitry, pulse frequency modulation circuitry, non-overlapping signal generation circuitry, and other circuitry known in the art configured to generate drive signals. Driver circuit 32 and driver circuit 34 may be implemented using switching transistor drivers known in the art, and drive signals GH and GL may be adapted to the particular transistor technology used to implement high-side switching transistor 18 and low-side switching transistor 19.

In various embodiments, high-side switching transistor 18 and low-side switching transistor 19 may be implemented, for example, using transistors such as IGBT transistors, MOS transistors (NMOS and/or PMOS), bipolar transistors, or other types of transistors. In some embodiments, high-side switching transistor 18 and low-side switching transistor 19 may be power IGBTs, power MOSFETs or power bipolar transistors to support high current and high power applications. In some embodiments, high-side switching transistor 18 and low-side switching transistor 19 may operate as switching transistors used in a switched mode power supply or to drive a motor. In some embodiments, charging system 2 may be adapted to support driving a single switching transistor. For example, drive circuit 34 and low-side switching transistor 19 may be omitted.

Driver circuits 32 and 34 may be implemented using drive circuit architectures known in the art, and may include auxiliary and support circuitry such as buffers, level shifters, isolation and circuits as is described in more detail in with respect to embodiments herein. As shown, driver circuit 32 is a floating driver that is powered by buffer capacitor 36 using floating high-side drive circuitry known in the art. As mentioned above, buffer capacitor 36 is periodically charged by charging circuit 12 and optional voltage booster 30 such that the voltage across booster capacitor 36 is at least threshold voltage $V_{T1}$ which may be about 10 V in some embodiments; however, other voltages may be used. Accordingly, during nominal operation, the voltage of boosted supply node BH is usually at least 10 V higher than the voltage of output node SH. Thus, when high-side switching transistor 18 is deactivated and low side switching transistor 19 is activated such that the voltage of output node SH is about ground voltage, the voltage at boosted supply node BH is at least 10V. When high-side switching transistor 18 is activated and low side switching transistor 19 is deactivated such that the voltage of output node SH is about the voltage of input voltage VBAT, the voltage at boosted supply node BH is at least 24V (e.g., 12 V battery voltage plus 12 V first threshold voltage $V_{T1}$.) Using a floating driver ensures that there is adequate gate drive voltage to keep high-side switching transistor 19 turned-on when drive signal DH is asserted. It should be understood that the specific voltages mentioned herein are just example voltages for specific embodiment the specific operational voltages may be different depending on the details of the particular embodiment and its specifications.

Figure 2A:
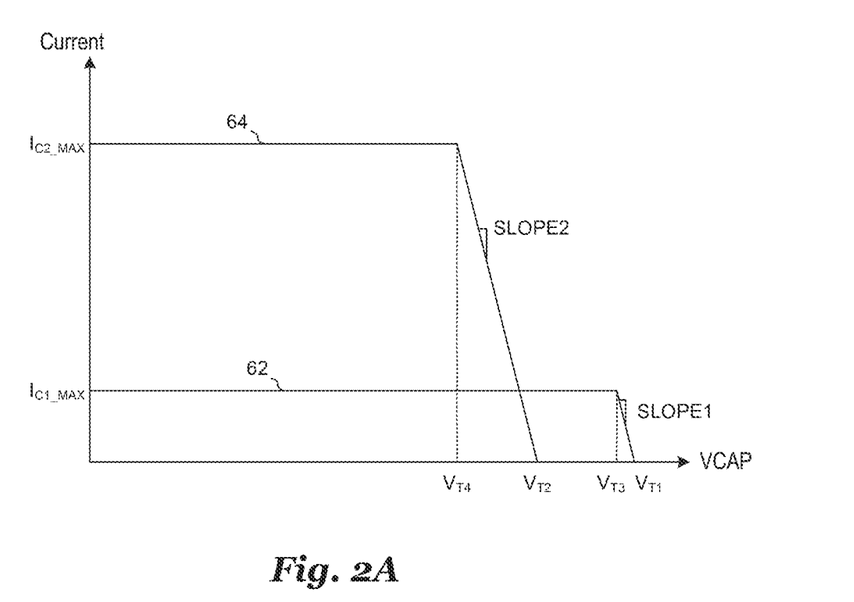
FIGS. 2A, 2B, 2C and 2D show graphs illustrating the operation of an embodiment charging circuit.

FIG. 2A illustrates a graph showing the relationship between the currents $I_{C1}$ and $I_{C2}$ respectively produced by low current path circuit 26 and high current path circuit 28 with respect to the voltage VCAP across buffer capacitor 36. Trace 62 represents first current $I_{C1}$ produced by low current path circuit 26, and trace 64 represents second current $I_{C2}$ produced by high current path circuit 28. As shown with respect to trace 62, when voltage VCAP across buffer capacitor 36 exceeds first threshold voltage $V_{T1}$, the current produced by low current path circuit 26 is about zero. When voltage VCAP falls below first threshold voltage $V_{T1}$, low current path circuit 26 produces a current that is inversely proportional to voltage VCAP according to a first slope SLOPE1. Once current $I_{C1}$ reaches a first maximum current $I_{C1\_MAX}$ (e.g., when voltage VCAP falls to voltage $V_{T3}$) low current path circuit 26 outputs first maximum current $I_{C1\_MAX}$. Similarly, when voltage VCAP falls below second threshold voltage $V_{T2}$, high current path circuit 28 produces a current $I_{C2}$ (represented by trace 64) that is inversely proportional to voltage VCAP according to a second slope SLOPE2. Once current $I_{C2}$ reaches a second maximum current $I_{C2\_MAX}$ (e.g., when voltage VCAP falls to voltage $V_{T4}$) high current path circuit 26 outputs second maximum current $I_{C2\_MAX}$. In various embodiments, first maximum current $I_{C1\_MAX}$ is less than second maximum current $I_{C2\_MAX}$. In one embodiment, first maximum current $I_{C1\_MAX}$ is about 20 mA, second maximum current $I_{C2\_MAX}$ is about 200 mA, first threshold $V_T$ is about 10 V and second threshold $V_{T2}$ is about 9 V, however, other maximum current and threshold values may be used depending on the embodiment and its specifications. Slope SLOPE1 of first current $I_{C1}$ and slope SLOPE2 of second current $I_{C1}$ may be the same or different depending on the particular embodiment and its specifications. In some embodiments, such as embodiments that utilize comparators and/or in embodiments in which first current path circuit 26 and second current path circuit 28 are not gradually turned on and off, slope SLOPE1 of first current $I_{C1}$ and slope SLOPE2 of second current $I_{C1}$ may be very high. In some embodiments, hysteresis may be applied to first threshold voltage $V_{T1}$ and/or second threshold voltage $V_{T2}$.

Figure 2B:
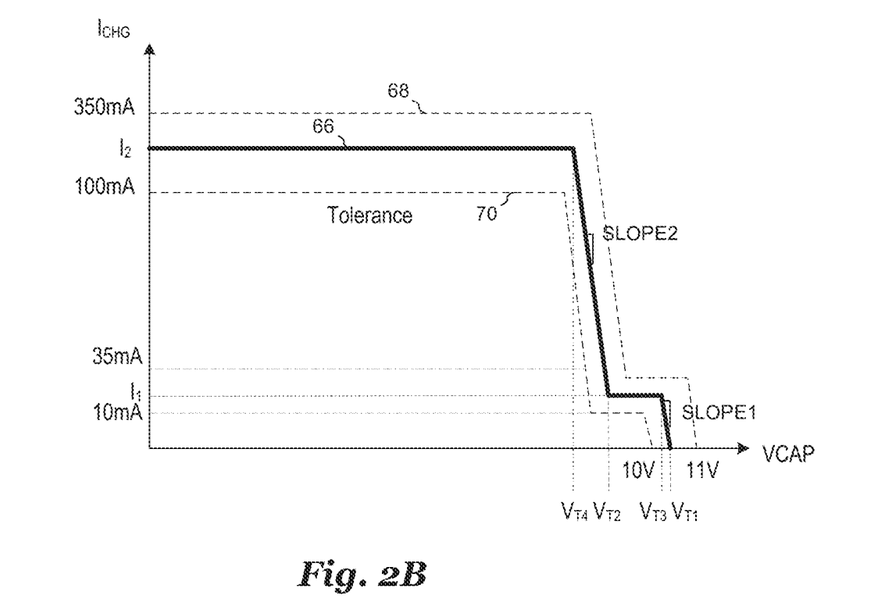

FIG. 2B illustrates a graph showing the relationship between the output current $I_{CHG}$ (represented by trace 66) of charging circuit 12 with respect to the voltage VCAP across buffer capacitor 36. Output current $I_{CHG}$ is the sum of currents $I_{C1}$ and $I_{C2}$ respectively produced by low current path circuit 26 and high current path circuit 28 depicted in FIG. 2A. As shown, when voltage VCAP across buffer capacitor 36 exceeds first threshold voltage $V_{T1}$, the current produced by low current path circuit 26 is about zero. When voltage VCAP falls below first threshold voltage $V_T$, charging circuit 12 produces a current that is inversely proportional to voltage VCAP according to a first slope SLOPE1, and when voltage VCAP reaches voltage $V_{T3}$, current $I_{CHG}$ plateaus at current $I_1$, which corresponds to first maximum current $I_{C1\_MAX}$ shown in FIG. 1A. When voltage VCAP falls below second threshold voltage $V_{T2}$, charging circuit 12 produces a current that is inversely proportional to voltage VCAP according to second slope SLOPE2, and when voltage VCAP reaches voltage $V_{T4}$, current $I_{CHG}$ plateaus at current $I_2$, which corresponds to second maximum current $I_{C2\_MAX}$ shown in FIG. 1A.

In some embodiments, the actual value of current $I_{CHG}$ with respect to voltage VCAP may vary according to temperature, operating conditions, and the application of hysteresis to first threshold voltage $V_{T1}$ and second threshold voltage $V_{T2}$. In some embodiments, the variation may be kept within the bounds of a tolerance mask represented by lines 68 and 70 in FIG. 2B. For example, when voltage VCAP is lower than voltage $V_{T4}$, current $I_{CHG}$ may be between about 100 mA and about 350 mA. For VCAP voltages between voltage $V_{T4}$ and first threshold voltage $V_{T1}$, the allowable currents within the boundaries of the tolerance mask decreases accordingly. It should be understood that the relationship of current $I_{CHG}$ with respect to voltage VCAP and the boundaries of tolerance mask depicted in FIG. 2B is just one example of many possible examples. In alternative embodiments of the present invention, the current values, threshold voltages and tolerance mask values may be different depending on the particular embodiment and its specifications.

Figure 2C:
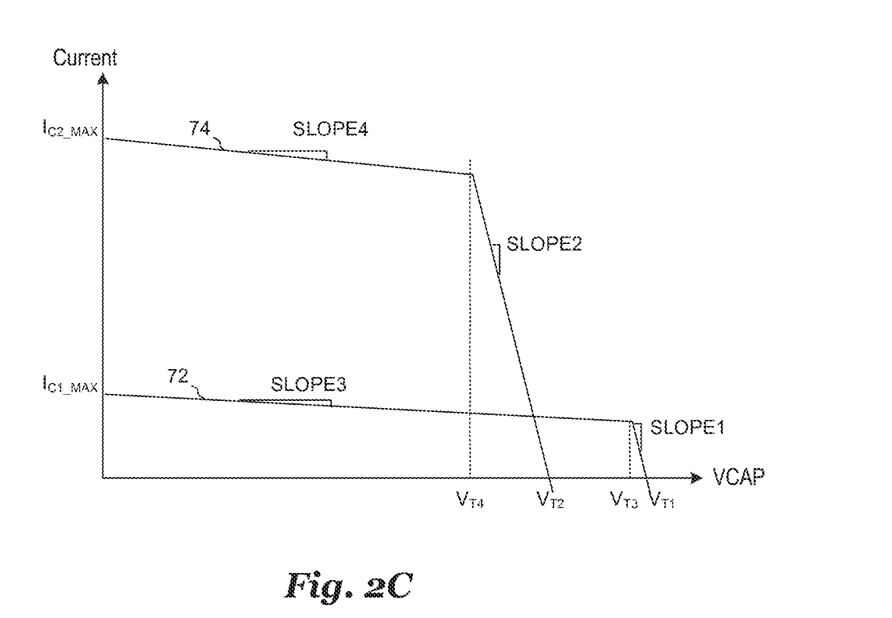

In some embodiment implementations of charging circuit 12, the relationship between first current $I_{C1}$ and voltage VCAP across buffer capacitor 36 might not be completely flat for values of voltage VCAP below voltage $V_{T3}$, and the relationship between second current $I_{C2}$ and voltage VCAP across buffer capacitor 36 might not be completely flat for values of voltage VCAP below voltage $V_{T4}$ as shown in FIG. 2C. FIG. 2C is similar to FIG. 2A, with the exception that first current $I_{C1}$ (represented by trace 72) has a slope SLOPE3 when voltage VCAP is below voltage $V_{T3}$, and second current $I_{C2}$ (represented by trace 74) has a slope SLOPE4 when voltage VCAP is below voltage $V_{T4}$. In various embodiments, the continued rise of first current $I_{C1}$ and second current $I_{C2}$ is due to finite impedances in the specific implementation of charging circuit 12. It should be understood that the relationship among first current $I_{C1}$, second current $I_{C2}$ and voltage VCAP of buffer capacitor 36 shown in FIG. 2C is just one of many example relationships. In alternative embodiments, first current $I_{C1}$ and second current $I_{C2}$ may have a relationship that is different from the first-order relationship represented by the straight lines of traces 72 and 74. In such embodiments, the relationship among first current $I_{C1}$, second current $I_{C2}$ and voltage VCAP of buffer capacitor 36 may have a higher order (e.g., more "curved") relationship and may even be non-monotonic in some cases.

Figure 2D:
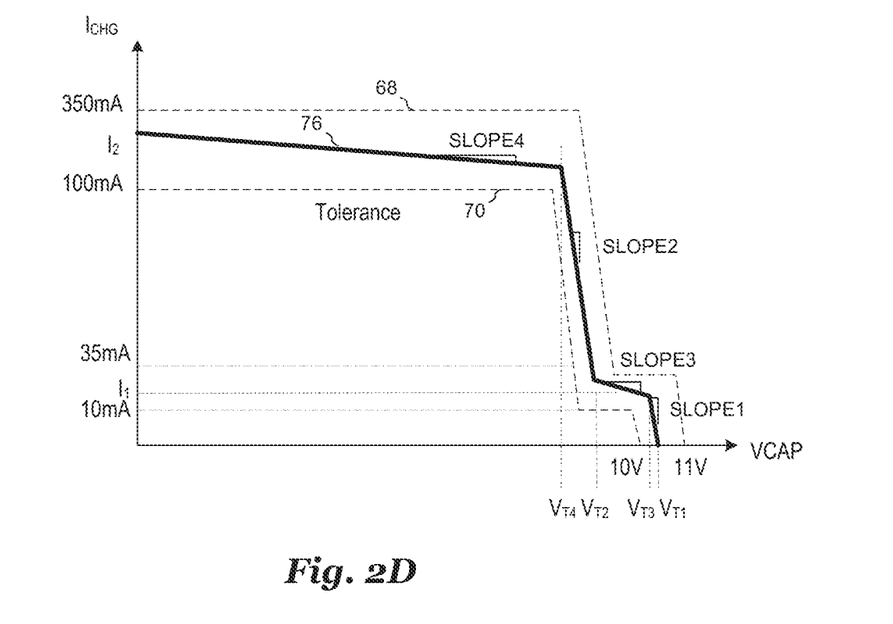

FIG. 2D illustrates a graph showing the relationship between the output current $I_{CHG}$ (represented by trace 76) of charging circuit 12 with respect to the voltage VCAP across buffer capacitor 36 according to the current characteristics of first current $I_{C1}$ and second current $I_{C2}$ describe above with respect to FIG. 2E. As shown, even though the shape of trace 76 is different from the shape of trace 66 shown and discussed above with respect to FIG. 2B, output current $I_{CHG}$ is maintained within the tolerance mask represented by lines 68 and 70.

Figure 3A:
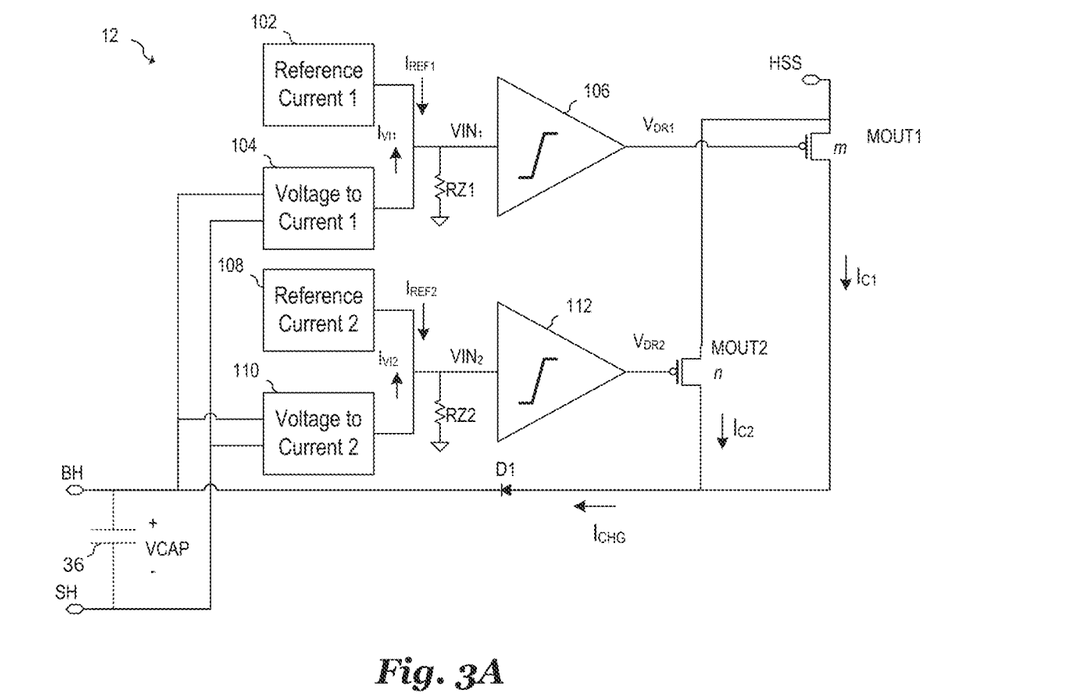
FIGS. 3A and 3B illustrate schematics of an embodiment charging circuit.

FIG. 3A illustrates a schematic of charging circuit 12 that may be used to implement charging circuit 12 shown in FIG. 1. In an embodiment, low current path circuit 26 is implemented using PMOS transistor MOUT1 having a load path coupled between power supply node HSS and driver circuit supply node, and high current path circuit 28 is implemented using PMOS transistor MOUT2 coupled between power supply node HSS and driver circuit supply node. PMOS transistor MOUT 1 has an aspect ratio m, and PMOS transistor MOUT2 has aspect ratio n, where n is larger than m (e.g., PMOS transistor MOUT2 is larger than PMOS transistor MOUT1 in order to provide a higher current). Diode D1 prevents buffer capacitor 36 from discharging through PMOS transistor MOUT1 or PMOS transistor MOUT2. The function of amplifier 22 shown in FIG. 1 is implemented using first reference current generator 102, first voltage to current converter 104, and first limiting amplifier 106. Similarly, the function of amplifier 22 shown in FIG. 1 is implemented using second reference current generator 108, second voltage to current converter 110, and second limiting amplifier 112. Resistors RZ1 and RZ2 represent finite resistances at the outputs of first voltage to current converter 104 and second voltage to current converter 110, respectively.

During operation, first voltage to current converter 104 converts voltage VCAP across buffer capacitor 36 (coupled between boosted supply node BH and output node SH) to a first measurement current $I_{VT1}$. This current is summed with current IREF1 generated by first reference current generator 102, and the summed current is applied to resistor RZ1 to produce an input voltage $VIN_1$ to first limiting amplifier 106. Input voltage $VIN_1$ is amplified by first limiting amplifier 106 to generate voltage $V_{DR1}$ configured to drive PMOS transistor MOUT1. Similarly, second voltage to current converter 104 converts voltage VCAP across buffer capacitor 36 to a second measurement current $I_{VT2}$. This current is summed with current IREF2 generated by second reference current generator 108, and the summed current is applied to resistor RZ2 to produce an input voltage $VIN_2$ to second limiting amplifier 112. Input voltage $VIN_2$ is amplified by second limiting amplifier 112 to generate voltage $V_{DR2}$ configured to drive PMOS transistor MOUT2. In various embodiments, first voltage threshold $V_{T1}$ may be set via the selection of reference current IREF1 and the transconductance of first voltage-to-current converter 104. The magnitude of the output current $I_{C1}$ of PMOS transistor may be set by selecting of the size of PMOS transistor MOUT1, as well as selecting the output voltage limits of first limiting amplifier 106. Likewise, the magnitude of the output current $I_{C2}$ of PMOS transistor may be set by selecting the size of PMOS transistor MOUT2, as well selecting the output voltage limits of second limiting amplifier 112. In some embodiments, the effective size of PMOS transistors MOUT1 and MOUT2, the gains and limits of first limiting amplifier 106 and second limiting amplifier 112, the transconductances of first voltage to current converter 104 and second voltage to current converter 110, and reference currents $I_{REF1}$ and $I_{REF2}$ produced by first reference current generator 102 and second reference current generator 108 may be programmable.

Figure 3B:
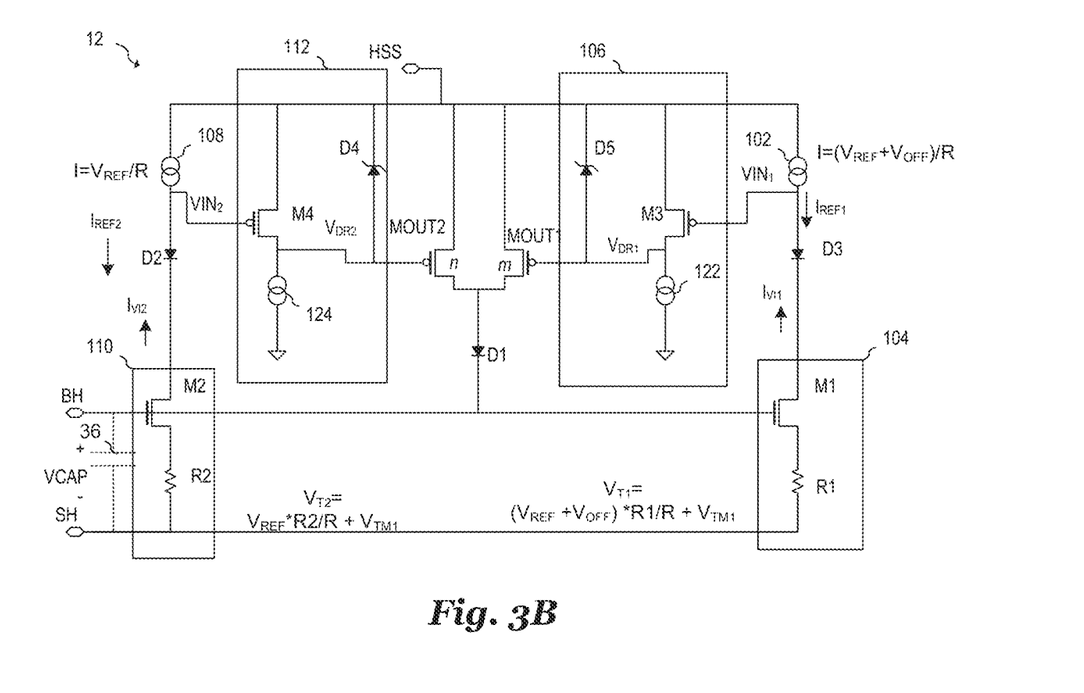

FIG. 3B illustrates a schematic of a transistor-level circuit that can be used to implement charging circuit 12 depicted in FIGS. 1 and 3A. As shown, first voltage to current converter 104 is implemented using NMOS transistor M1 and resistor R1 coupled to the source of NMOS transistor M1. First reference current generator 102 is implemented using a current source, and first limiting amplifier is implemented using PMOS transistor M3, current source 122 and Zener diode D5. Optional diode D3 may be coupled between first reference current generator 102 and first voltage to current converter 104. Similarly, second voltage to current converter 110 is implemented using NMOS transistor M2 and resistor R2 coupled to the source of NMOS transistor M2. Second reference current generator 108 is implemented using a current source, and second limiting amplifier 112 is implemented using PMOS transistor M4, current source 124 and Zener diode D4. Optional diode D2 may be coupled between second reference current generator 108 and second voltage to current converter 110.

First voltage to current converter 104 has a transconductance of about 1/R1 when transistor M1 has a high aspect ratio and when voltage VCAP across buffer capacitor 36 exceeds the threshold voltage $V_{TM1}$ of NMOS transistor M1; and second voltage to current converter 110 has a transconductance of about 1/R2 when transistor M2 has a high aspect ratio and when voltage VCAP across buffer capacitor 36 exceeds the threshold voltage $V_{TM2}$ of NMOS transistor M1. In various embodiments, the current $I_{REF1}$ produced by first reference current generator 102 is set to $(V_{REF}+V_{OFF})/R$, second current $I_{REF2}$ produced by second reference current generator 108 is set to $V_{REF}/R$ and where $V_{REF}$ represents a reference voltage, $V_{OFF}$ represents an offset voltage, and R represents a resistance of a reference resistor.

In some embodiments, reference currents proportional to $(V_{REF}+V_{OFF})/R$ and $V_{REF}/R$ are generated by applying a voltages generated by a bandgap voltage reference circuit (or scaled voltages) to one or more reference resistors (not shown) having a value proportional to R to produce reference currents using bias generation circuits and methods known in the art. These reference currents are mirrored to first reference current generator 102 and second reference current generator 108 using, for example, current mirror circuits known in the art (not shown). In various embodiments, the reference resistor used in the bias generator uses the same material (e.g., polysilicon, diffusion, etc.) as resistors R1 and R2 in first and second voltage to current converters 104 and 110 such that the ratio R/R1 and R/R2 are substantially constant over semiconductor process and temperature. In one embodiment, first and second threshold voltages $V_{T1}$ and $V_{T2}$ can be expressed as follows:

$$V_{T1}=(V_{REF}+V_{OFF})*R2/R+V_{TM1}, \text{ and}$$

$$V_{T2}=V_{REF}*R2/R+V_{TM1}.$$

During operation, PMOS transistor M3 loaded with current source 122 of first limiting amplifier 106 amplifies input voltage $VIN_1$ to generate voltage $V_{DR1}$ configured to drive PMOS transistor MOUT1. Zener diode D5 limits/clamps output voltage $V_{DR1}$ of first limiting amplifier to its Zener voltage to effectively limit the amount of current output by PMOS transistor MOUT1. Similarly, PMOS transistor M4 loaded with current source 124 of first limiting amplifier 106 amplifies input voltage $VIN_2$ to generate voltage $V_DR2$ configured to drive PMOS transistor MOUT2. Zener diode D4 limits/clamps output voltage $V_{DR2}$ of first limiting amplifier to its Zener voltage to effectively limit the amount of current output by PMOS transistor MOUT2.

It should be appreciated that the embodiment examples of charging circuit 12 shown and described above with respect to FIGS. 3A and 3B, are just specific examples of many possible embodiment charging circuits. In alternative embodiments, other transistor types may be used instead of PMOS transistors for MOUT1 and MOUT2, such as NMOS transistors, NPN or PNP BJT transistors, JFETS, and other transistor types known in the art. First and second voltage to current converters 104 and 110 may be implemented using other voltage-to-current converter circuits and systems, and first and second limiting amplifiers 106 and 112 may be implemented using other limiting amplifier circuits and systems known in the art. In addition, the clamping functions of zener diodes D4 and D5 described above may be implemented using other clamping circuits and systems known in the art. For example, in some embodiments, transistor-based clamping circuits may be used.

Figure 4:
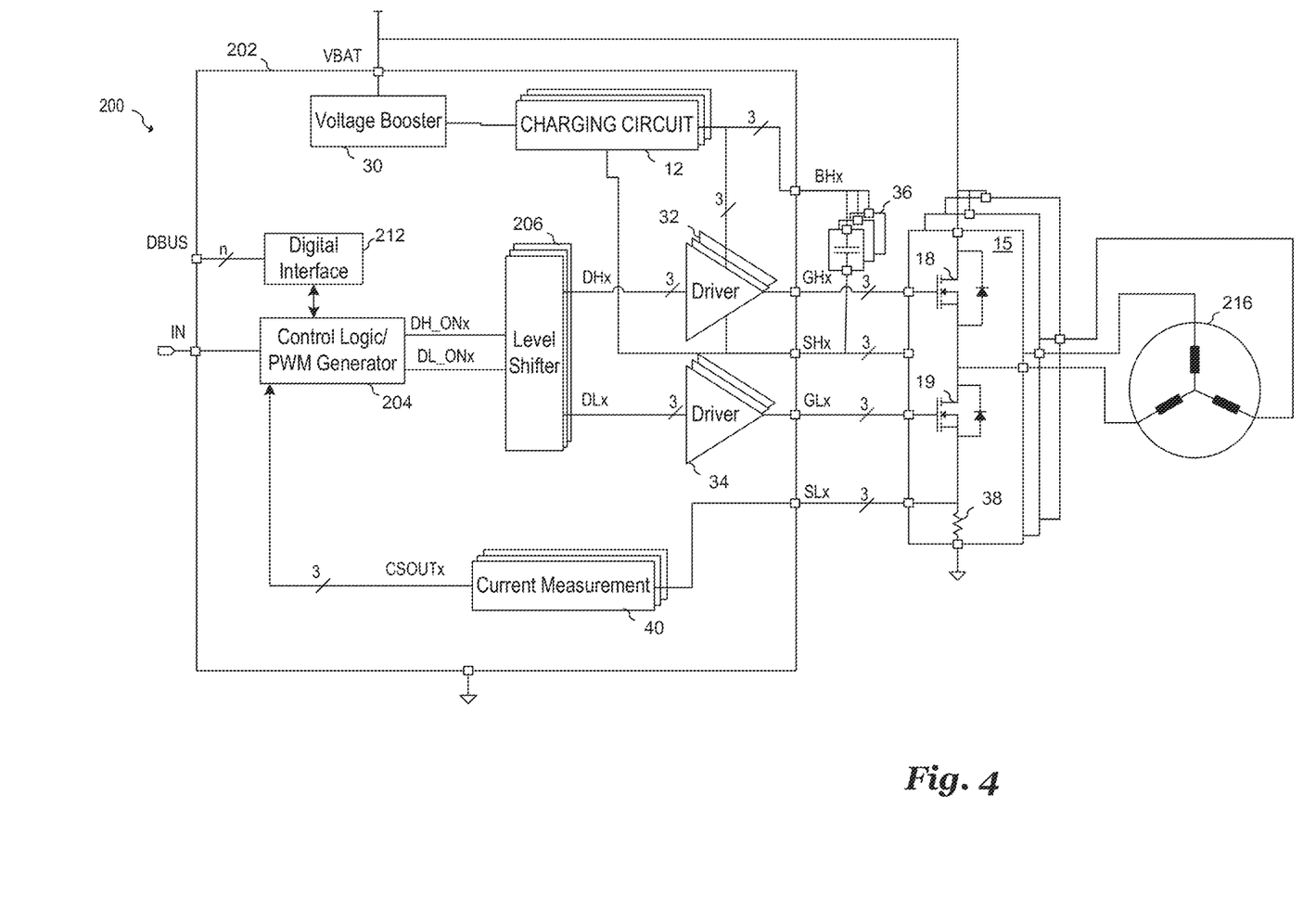
FIG. 4 illustrates a schematic of an embodiment motor control system.

FIG. 4 illustrates a motor system 200 that includes integrated circuit 202 coupled to three-phase motor 216 via three half-bridge driver circuits 15. In some embodiments three-phase motor 216 may be used in an automotive system. In one example, three-phase motor is a motor used for power steering. Integrated circuit 202 is similar to integrated circuit 10 shown in FIG. 1 in terms of structure and operation, with the exception that three parallel half-bridge driver channels are implemented instead of a single channel. For example, control logic 204 is configured to provide three channels of input drive signals represented by signals DHx and DLx. Three level shifters 206, three high-side drivers 32 and three low-side drivers 34 are provided to support the driving and activation of each of the three half-bridge drivers 15 via drive outputs GHx and GLx. Accordingly, in some embodiments, three embodiment charging circuits 12 are configured to charge three buffer capacitors 36 to provide power to three corresponding driver circuits 32 according to embodiments described herein. In various embodiments, three current measurement circuits 40 are configured to measure the current of each half-bridge driver by measuring the voltage across shut resistors 38 of half-bridge drivers 15 at nodes DLx.

In various embodiments, control logic 204 is configured to generate three-phase input drive signals DHx and DLx that are configured to drive three-phase motor 216 according to three-phase motor driving methods known in the art. In some embodiments, each phase of input drive signals DHx and DLx are configured to provide three-phase pulse-width modulated signals that provide motor drive signals be phase shifted about 120 degrees from each other. In some embodiments, each pulse-width modulated signal comprises a plurality of pulse cycles whose pulse-width and/or pulse density increases and decreases over a single motor drive cycle. The peak pulse-width of each channel is shifted 120 degrees with respect to the other channels. In other embodiments, each pulse-width modulated signal comprises a single pulse cycle for a single motor drive cycle. In such embodiments, each single pulse cycle of each channel is shifted 120 degrees with respect to the other channels.

Digital interface 212 is shown coupled to a digital bus DBUS having n signal pins and may be used to control, configure and monitor the operation of integrated circuit 202. In various embodiments, digital interface 212 may be a serial bus interface circuit, a parallel bus interface circuit, and/or may comply with any bus standard including, but not limited to SPI, CAN, I2C, LVDS, and USB. Accordingly, the number n of signal pins of digital bus DBUS may be any number appropriate to the implemented bus protocol. In some embodiments, various operational parameters of integrated circuit 202 may be received from digital bus DBUS via digital interface 212 and transferred to registers within control logic 204 in order to control the generation of drive signals DH and DL.

Figure 5:
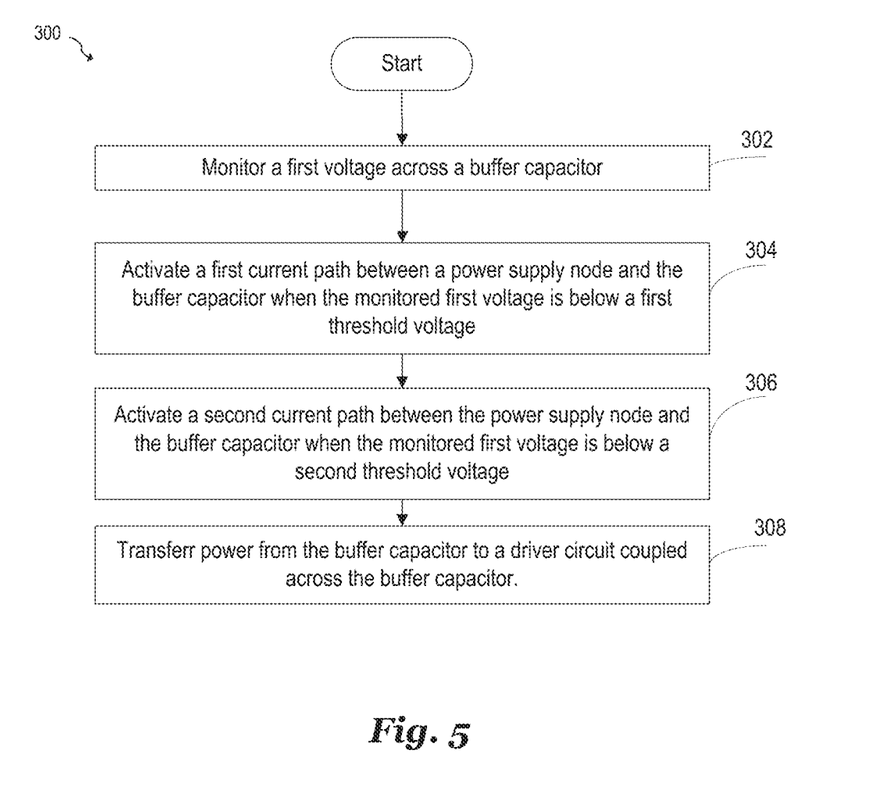
FIG. 5 illustrates a block diagram of an embodiment method.

FIG. 5 illustrates a block diagram of an embodiment method 300. In step 302, a first voltage is monitored across a buffer capacitor, such as voltage VCAP across buffer capacitor 36 illustrated in FIGS. 1, 3A, 3B and 4. In some embodiments, the first voltage is monitored using an amplifier, such as amplifiers 22 and 24 or voltage-to-current converters 104 and 110 illustrated in FIGS. 3A and 3B. In other embodiments, the first voltage may be monitored using a comparator circuit.

In step 304, a first current path is activated between a power supply node and the buffer capacitor when the monitored first voltage is below a first threshold voltage. In some embodiments, the first current path may be implemented using low current path circuit 26 shown in FIG. 1 and/or may be implemented using PMOS transistor MOUT1 shown in FIGS. 3A and 3B. In various embodiments, the first current path provides a first current proportional to a difference between the first threshold voltage and the monitored first voltage up to a first maximum current.

In step 306, a second current path is activated between the power supply node and the buffer capacitor when the monitored first voltage is below a second threshold voltage. In some embodiments, the second current path may be implemented using high current path circuit 28 shown in FIG. 1 and/or may be implemented using PMOS transistor MOUT2 shown in FIGS. 3A and 3B. In various embodiments, the second current path provides a second current proportional to a difference between the second threshold voltage and the monitored first voltage up to a second maximum current, such that the first threshold voltage is greater than the second threshold voltage, and the first maximum current is less than the second maximum current. In step 308, power is transferred from the buffer capacitor to a driver circuit coupled across the buffer capacitor. In various embodiments, the driver circuit may be implemented using driver 32, which may be, for example, a high-side driver.

Embodiments of the present invention are summarized here. Other embodiments can also be understood from the entirety of the specification and the claims filed herein.

Example 1

A method, including: monitoring a first voltage across a buffer capacitor; activating a first current path between a power supply node and the buffer capacitor when the monitored first voltage is below a first threshold voltage, where the first current path provides a first current proportional to a difference between the first threshold voltage and the monitored first voltage up to a first maximum current; activating a second current path between the power supply node and the buffer capacitor when the monitored first voltage is below a second threshold voltage, where the second current path provides a second current proportional to a difference between the second threshold voltage and the monitored first voltage up to a second maximum current, where the first threshold voltage is greater than the second threshold voltage, and the first maximum current is less than the second maximum current; and transferring power from the buffer capacitor to a driver circuit coupled across the buffer capacitor.

Example 2

The method of example 1, further including driving a control node of a switching transistor of a half-bridge circuit using the driver circuit.

Example 3

The method of example 2, further including driving a motor with the half-bridge circuit.

Example 4

The method of example 2 or 3, further including measuring a current of the half-bridge circuit.

Example 5

The method of example 4, where: measuring the current of the half-bridge circuit includes using an analog-to-digital converter; and the first current corresponds to a magnitude that is less than a least-significant bit of the analog-to-digital converter.

Example 6

The method of one of examples 1 to 5, where monitoring the first voltage includes: converting the first voltage to a first measurement current; comparing the first measurement current to a first reference current; converting the first voltage to a second measurement current; and comparing the second measurement current to a second reference current.

Example 7

The method of example 6, where: activating the first current path includes turning on a first transistor coupled between the power supply node and the buffer capacitor when the first measurement current is less than the second measurement current; and activating the second current path includes turning on a second transistor coupled between the power supply node and the buffer capacitor when the second measurement current is less than the second measurement current, where the second transistor is larger than the first transistor.

Example 8

The method of one of examples 1 to 7, where the second current is at least ten times greater than the first current.

Example 9

A system including: a driver circuit having a driver circuit supply node configured to be coupled to a first terminal of a buffer capacitor, a reference node configured to be coupled a second terminal of the buffer capacitor, and a drive output configured to be coupled to a control node of a switching transistor; a first current path circuit coupled between a power supply node and the driver circuit supply node; a second current path circuit coupled between the power supply node and the driver circuit supply node; and a buffer capacitor monitoring circuit configured to: measure a first voltage between the driver circuit supply node and the reference node, activate the first current path circuit when the measured first voltage is below a first threshold voltage and cause to the first current path circuit to output a first current proportional to a difference between the first threshold voltage and the first voltage up to a first maximum current, and activate the second current path circuit when the measured first voltage is below a second threshold voltage and cause the second current path circuit to output a second current proportional to a difference between the second threshold voltage and the first voltage up to a second maximum current, where the first threshold voltage is greater than the second threshold voltage, and the first maximum current is less than the second maximum current.

Example 10

The system of example 9, where the switching transistor is a high-side transistor of a half-bridge circuit, and the reference node is further configured to be coupled to an output node of the high-side transistor.

Example 11

The system of one of examples 9 or 10, further including the buffer capacitor and the half-bridge circuit.

Example 12

The system of one of examples 9 to 11, further including a motor coupled to an output of the half-bridge circuit.

Example 13

The system of one of examples 9 to 12, further including a current measurement circuit having an analog-to-digital converter, where the current measurement circuit is configured to be coupled to the half-bridge circuit, the current measurement circuit is configured to measure a current of the half-bridge circuit using the analog-to-digital converter, and the first current corresponds to a magnitude that is less than a least-significant bit of the analog-to-digital converter.

Example 14

The system of one of examples 9 to 13, where the buffer capacitor monitoring circuit includes: a first voltage-to-current converter coupled between the driver circuit supply node and the reference node; a first reference current generator coupled to the first voltage-to-current converter and to the first current path circuit; a second voltage-to-current converter coupled between the driver circuit supply node and the reference node; and a second reference current generator coupled to the second voltage-to-current converter and to the second current path circuit.

Example 15

The system of one of example 14, where: the first current path circuit includes a first transistor having a load path coupled between the power supply node and the driver circuit supply node, and a control node coupled to the first voltage-to-current converter; and the second current path circuit includes a second transistor having a load path coupled between the power supply node and the driver circuit supply node, and a control node coupled to the second voltage-to-current converter, where the second transistor is larger than the first transistor.

Example 16

The system of one of examples 9 to 15, where the second current is at least ten times greater than the first current.

Example 17

The system of one of examples 9 to 16, where the driver circuit, the first current path circuit, the second current path circuit, and the buffer capacitor monitoring circuit are disposed on a single semiconductor substrate.

Example 18

A motor system including: a half-bridge circuit including a high-side transistor and a low-side transistor; a high-side driver having an output coupled to a control node of the high-side transistor; a low-side driver having an output coupled to a control node of the low-side transistor; a buffer capacitor coupled having a first terminal coupled to a boosted supply node and to a supply node of the high-side driver and a second terminal coupled to a reference node of the high-side driver and to an output node of the half-bridge circuit; a first transistor coupled between a power supply node and the boosted supply node, the first transistor configured to provide a first current; a second transistor coupled between the power supply node and the boosted supply node, the second transistor configured to provide a second current that is at least ten times greater than the first current; a buffer capacitor monitoring circuit configured to: measure a first voltage between the boosted supply node and the reference node, activate the first transistor when the measured first voltage is below a first threshold, measure a second voltage between the boosted supply node and the reference node, and activate the second transistor when the measured first voltage is below a second threshold, where the first threshold is greater than the second threshold; and an analog-to-digital converter coupled to the half-bridge circuit, the analog-to-digital converter configured to digitize a current flowing through the half-bridge circuit.

Example 19

The motor system of example 18, further including a motor coupled to the output node of the half-bridge circuit.

Example 20

The motor system of one of examples 18 or 19, where the high-side transistor and the low-side transistor each includes a MOSFET.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
   monitoring a first voltage across a buffer capacitor;
   activating a first current path between a power supply node and the buffer capacitor when the monitored first voltage is below a first threshold voltage, wherein the first current path provides a first current proportional to a difference between the first threshold voltage and the monitored first voltage up to a first maximum current;
   activating a second current path between the power supply node and the buffer capacitor when the monitored first voltage is below a second threshold voltage, wherein the second current path provides a second current proportional to a difference between the second threshold voltage and the monitored first voltage up to a second maximum current, wherein the first threshold voltage is greater than the second threshold voltage, and the first maximum current is less than the second maximum current; and
   transferring power from the buffer capacitor to a driver circuit coupled across the buffer capacitor.

2. The method of claim 1, further comprising driving a control node of a switching transistor of a half-bridge circuit using the driver circuit.

3. The method of claim 2, further comprising driving a motor with the half-bridge circuit.

4. The method of claim 2, further comprising measuring a current of the half-bridge circuit.

5. The method of claim 4, wherein:
  measuring the current of the half-bridge circuit comprises using an analog-to-digital converter; and
  the first current corresponds to a magnitude that is less than a least-significant bit of the analog-to-digital converter.

6. The method of claim 1, wherein monitoring the first voltage comprises:
  converting the first voltage to a first measurement current;
  comparing the first measurement current to a first reference current;
  converting the first voltage to a second measurement current; and
  comparing the second measurement current to a second reference current.

7. The method of claim 6, wherein:
  activating the first current path comprises turning on a first transistor coupled between the power supply node and the buffer capacitor when the first measurement current is less than the second measurement current; and
  activating the second current path comprises turning on a second transistor coupled between the power supply node and the buffer capacitor when the second measurement current is less than the second measurement current, wherein the second transistor is larger than the first transistor.

8. The method of claim 1, wherein the second current is at least ten times greater than the first current.

9. A system comprising:
  a driver circuit having a driver circuit supply node configured to be coupled to a first terminal of a buffer capacitor, a reference node configured to be coupled a second terminal of the buffer capacitor, and a drive output configured to be coupled to a control node of a switching transistor;
  a first current path circuit coupled between a power supply node and the driver circuit supply node;
  a second current path circuit coupled between the power supply node and the driver circuit supply node; and
  a buffer capacitor monitoring circuit configured to:
    measure a first voltage between the driver circuit supply node and the reference node,
    activate the first current path circuit when the measured first voltage is below a first threshold voltage and cause the first current path circuit to output a first current proportional to a difference between the first threshold voltage and the first voltage up to a first maximum current, and
    activate the second current path circuit when the measured first voltage is below a second threshold voltage and cause the second current path circuit to output a second current proportional to a difference between the second threshold voltage and the first voltage up to a second maximum current, wherein the first threshold voltage is greater than the second threshold voltage, and the first maximum current is less than the second maximum current.

10. The system of claim 9, wherein the switching transistor is a high-side transistor of a half-bridge circuit, and the reference node is further configured to be coupled to an output node of the high-side transistor.

11. The system of claim 10, further comprising the buffer capacitor and the half-bridge circuit.

12. The system of claim 11, further comprising a motor coupled to an output of the half-bridge circuit.

13. The system of claim 10, further comprising a current measurement circuit having an analog-to-digital converter, wherein
  the current measurement circuit is configured to be coupled to the half-bridge circuit,
  the current measurement circuit is configured to measure a current of the half-bridge circuit using the analog-to-digital converter, and
  the first current corresponds to a magnitude that is less than a least-significant bit of the analog-to-digital converter.

14. The system of claim 9, wherein the buffer capacitor monitoring circuit comprises:
  a first voltage-to-current converter coupled between the driver circuit supply node and the reference node;
  a first reference current generator coupled to the first voltage-to-current converter and to the first current path circuit;
  a second voltage-to-current converter coupled between the driver circuit supply node and the reference node; and
  a second reference current generator coupled to the second voltage-to-current converter and to the second current path circuit.

15. The system of claim 14, wherein:
  the first current path circuit comprises a first transistor having a load path coupled between the power supply node and the driver circuit supply node, and a control node coupled to the first voltage-to-current converter; and
  the second current path circuit comprises a second transistor having a load path coupled between the power supply node and the driver circuit supply node, and a control node coupled to the second voltage-to-current converter, wherein the second transistor is larger than the first transistor.

16. The system of claim 9, wherein the second current is at least ten times greater than the first current.

17. The system of claim 9, wherein the driver circuit, the first current path circuit, the second current path circuit, and the buffer capacitor monitoring circuit are disposed on a single semiconductor substrate.

18. A motor system comprising:
  a half-bridge circuit comprising a high-side transistor and a low-side transistor;
  a high-side driver having an output coupled to a control node of the high-side transistor;
  a low-side driver having an output coupled to a control node of the low-side transistor;
  a buffer capacitor having a first terminal coupled to a boosted supply node and to a supply node of the high-side driver and a second terminal coupled to a reference node of the high-side driver and to an output node of the half-bridge circuit;
  a first transistor coupled between a power supply node and the boosted supply node, the first transistor configured to provide a first current;
  a second transistor coupled between the power supply node and the boosted supply node, the second transistor configured to provide a second current;
  a buffer capacitor monitoring circuit configured to:
    measure a first voltage between the boosted supply node and the reference node,
    activate the first transistor when the measured first voltage is below a first threshold,
    measure a second voltage between the boosted supply node and the reference node, and activate the second transistor when the measured first voltage is below a second threshold, wherein the first threshold is greater than the second threshold; and an analog-to-digital converter coupled to the half-bridge circuit and configured to digitize a current flowing through the half-bridge circuit.

19. The motor system of claim 18, further comprising a motor coupled to the output node of the half-bridge circuit.

20. The motor system of claim 18, wherein the high-side transistor and the low-side transistor each comprises a MOSFET.

* * * * *